(12) United States Patent
Dandy et al.

(10) Patent No.: US 7,358,717 B2
(45) Date of Patent: Apr. 15, 2008

(54) INPUT BY-PASS CIRCUIT FOR A CURRENT PROBE

(75) Inventors: Jonathan S. Dandy, Beaverton, OR (US); Kerry A. Stevens, Beaverton, OR (US); Michael J. Mende, Portland, OR (US); Thomas J. Sharp, Tigard, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/430,394

(22) Filed: May 8, 2006

(65) Prior Publication Data

US 2007/0273361 A1    Nov. 29, 2007

(51) Int. Cl.
*G01R 1/20*    (2006.01)

(52) U.S. Cl. ............ 324/126; 324/754; 324/158.1

(58) Field of Classification Search ............ 324/126
See application file for complete search history.

(56) References Cited

U.S. PATENT DOCUMENTS

| | | | | |
|---|---|---|---|---|
| 1,887,421 A | * | 11/1932 | Newman | .......... 200/2 |
| 2,871,297 A | * | 1/1959 | Leonard | .......... 379/274 |
| 2,929,555 A | * | 3/1960 | Spencer et al. | .......... 318/573 |
| 3,265,971 A | * | 8/1966 | Montone | .......... 318/660 |
| 3,525,041 A | | 8/1970 | Velsink | |
| 3,800,214 A | * | 3/1974 | O'Flynn | .......... 324/508 |
| 4,176,313 A | * | 11/1979 | Wrinn | .......... 324/705 |
| 4,514,619 A | * | 4/1985 | Kugelman | .......... 219/483 |
| 5,006,809 A | * | 4/1991 | Mang et al. | .......... 324/715 |
| 5,136,252 A | * | 8/1992 | Witt | .......... 324/715 |
| 5,477,135 A | | 12/1995 | Baker | |
| 5,493,211 A | | 2/1996 | Baker | |
| 5,804,979 A | * | 9/1998 | Lund et al. | .......... 324/713 |
| 6,362,632 B1 | * | 3/2002 | Livingston | .......... 324/661 |
| 6,459,272 B1 | * | 10/2002 | Yamashita | .......... 324/529 |
| 6,667,626 B2 | * | 12/2003 | Takemoto et al. | .......... 324/754 |
| 6,737,875 B2 | * | 5/2004 | Davis et al. | .......... 324/713 |

* cited by examiner

*Primary Examiner*—Ha Tran Nguyen
*Assistant Examiner*—Richard Isla-rodas
(74) *Attorney, Agent, or Firm*—William K. Bucher

(57) ABSTRACT

An input by-pass circuit for a current probe has first and second switches coupled between current probe inputs and current sensing circuit inputs. A switch control is coupled to the switching circuit for selectively coupling and decoupling the current probe inputs to the current sensing circuit such that the current signal continuously flows in the device under test.

6 Claims, 4 Drawing Sheets

INPUT BY-PASS CIRCUIT FOR A CURRENT PROBE

BACKGROUND OF THE INVENTION

The present invention relates generally to current probes and more particularly to a input by-pass circuit for a current probe.

Current probes used with oscilloscopes apply transformer technology to measure current flowing in a conductor. FIG. 1 illustrates a current probe 10 for measuring current signal down to DC having transformer 12 with a ring-shaped magnetic core 14 defining an aperture 16. The ring-shaped magnetic core 14 is preferably a split core design where one side of the magnetic core is movable relative to the other sides. This allows a current carrying conductor 18 to be passed through the aperture 16 of the transformer 12 without having to disconnect the current carrying conductor 18 from a circuit. The current carrying conductor 18 is passed through the aperture in the magnetic core 14 and acts as the primary winding of the transformer 12. A secondary winding 20 is wrapped around one side of the magnetic core 14. To allow the current probe 10 to sense DC and low frequency current signals, a Hall effect device 22 is positioned in the magnetic core 14 such that the magnetic flux in the magnetic core is substantially perpendicular to the Hall effect device 22. A bias source 24 is applied to the Hall device 22 and the resulting voltage generated by the Hall effect due to the flux in the magnetic core 14 is coupled to the input of an differential amplifier 26. The single ended output of the differential amplifier 26 is coupled via a switch 28 to a power amplifier 30. The switch 28 is also coupled to receive a degaussing signal that is selectively applied to the transformer 12. The power amplifier 30 generates a current output proportional to the voltage generated by the Hall effect device 22. The power amplifier 30 is coupled to one side of a secondary winding 20 with the other side of the winding coupled to a transformer termination resistor 32 and voltage amplifier 34.

The current flowing in the current carrying conductor 18 induces a magnetic flux that is linked to the magnetic core 14 and the secondary winding 20. The magnetic flux caused by DC to low frequency current signal is coupled in the magnetic core 14 to the Hall effect device 22. The Hall effect device 22 generates a differential voltage that is coupled to the inputs of the differential amplifier 26. The output of the differential amplifier 26 is coupled through switch 28 to the power amplifier 30. The power amplifier 30 generates a current output that is coupled to the secondary winding 20 of the transformer 12. The current applied by the power amplifier is in a direction that nulls the flux in the magnetic core 14 caused by the DC to low frequency current signal in the current carrying conductor 18. Higher frequency current signals induce a current in the secondary winding that produces a magnetic flux that is opposite to that generated by the current flowing in the current carrying conductor 18. The current generate by the power amplifier 20 for DC to low frequency current signals and the current induced into the secondary winding 20 at higher current frequency signals are summed by the transformer termination resistor 32 which provides a voltage input to the amplifier 34. The voltage output of the amplifier 34 is a measure of the AC and DC components of the magnetic core flux. U.S. Pat. Nos. 3,525,041, 5,477,135 and 5,493,211 describe the concepts of the above current probe 10.

In order for a user to degauss the above described current probe, the current carrying conductor 18 needs to be removed from the current probe 10 other wise the degaussing signal will induce a current into the current carrying conductor 18 that could damage circuitry in the device under test. Additionally, the user needs to remove the current carrying conductor 18 from the current probe 10 if a sufficiently high current is flowing in the current carrying conductor 18 that would saturate the magnetic core 14 of the transformer 12.

What is needed in a current probe is a circuit that allows a user to keep the current probe attached to a current carrying conductor while degaussing the current probe or when a current signal is present that would saturate the magnetic core of the transformer. Additionally, the current probe circuit should allow a user the capability to set an offset voltage for the current probe without removing the current probe from the current carrying conductor.

SUMMARY OF THE INVENTION

Accordingly, the above needs are met with an input by-pass circuit for current probes. The current probe has inputs coupled to a current sensing circuit for receiving a current signal from a device under test with the input by-pass circuit having a switching circuit coupled between the current probe inputs and the current sensing circuit. A switch control is coupled to the switching circuit for selectively coupling and decoupling the current probe inputs to the current sensing circuit such that the current signal continuously flows in the device under test.

Each of the first and second switches has a common terminal coupled to one of the current probe inputs, a first terminal coupled to the current sensing circuit and a second terminal coupled to the other current probe input. The first and second switches couple the current signal to the current sensing circuit when the common switch terminals of the first and second switches are coupled to the first terminals of the first and second switches. The first and second switches couple the current signal between the current probe inputs when the common switch terminals of the first and second switches are coupled to the second terminals of the first and second switches.

The first and second switches of the input by-pass circuit may be implemented with magnetic-latch relays or mechanical switches. When the switches are magnetic latch relays, the switch control has at least a first activation switch generating a signal to a controller to initiate the generation of generating command signals coupled to a serial-to-parallel I/O expander. The serial-to-parallel I/O expander generates parallel output data for selectively coupling and decoupling the current probe inputs from the current sensing circuit with one of the command signals delaying one of the first and second switches with respect to the other. The switch control may also have a second activation switch generating a signal to a controller for initiating the generation of command signals coupled to a serial-to-parallel I/O expander. The serial-to-parallel I/O expander generates parallel output data for selectively decoupling the current probe inputs from the current sensing circuit with one of the command signals delaying one of the first and second switches with respect to the other and another command signal coupling a degaussing signal to the current sensing circuit.

When the first and second switches are mechanical switches, the switch control is a first actuator mechanically coupled to the first mechanical switch and a second actuator coupled to the second mechanical switch with the first and second actuators causing the first and second switches to selectively couple and decouple the current probe inputs from the current sensing circuit with the switching of one of the first and second switches being delayed with respect to the other.

The objects, advantages and novel features of the present invention are apparent from the following detailed description when read in conjunction with appended claims and attached drawings.

DETAILED DESCRIPTION OF THE INVENTION

Figure 1:
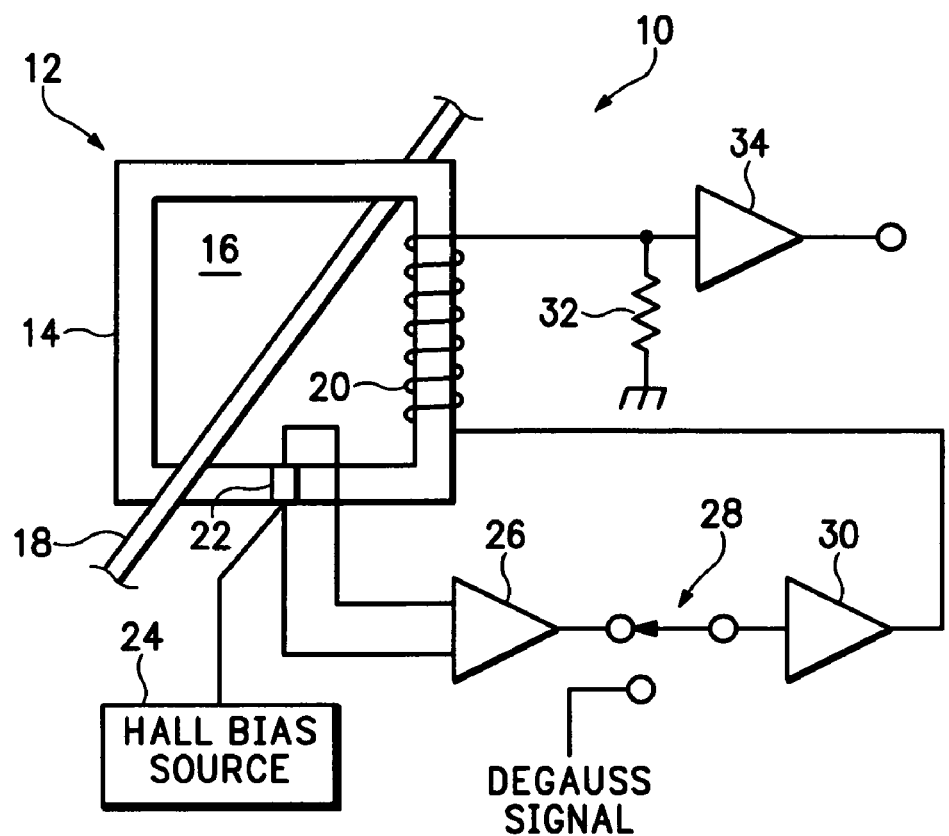
FIG. 1 is a schematic representation of a current probe using a current carrying conductor as a primary transformer winding.
Figure 2:
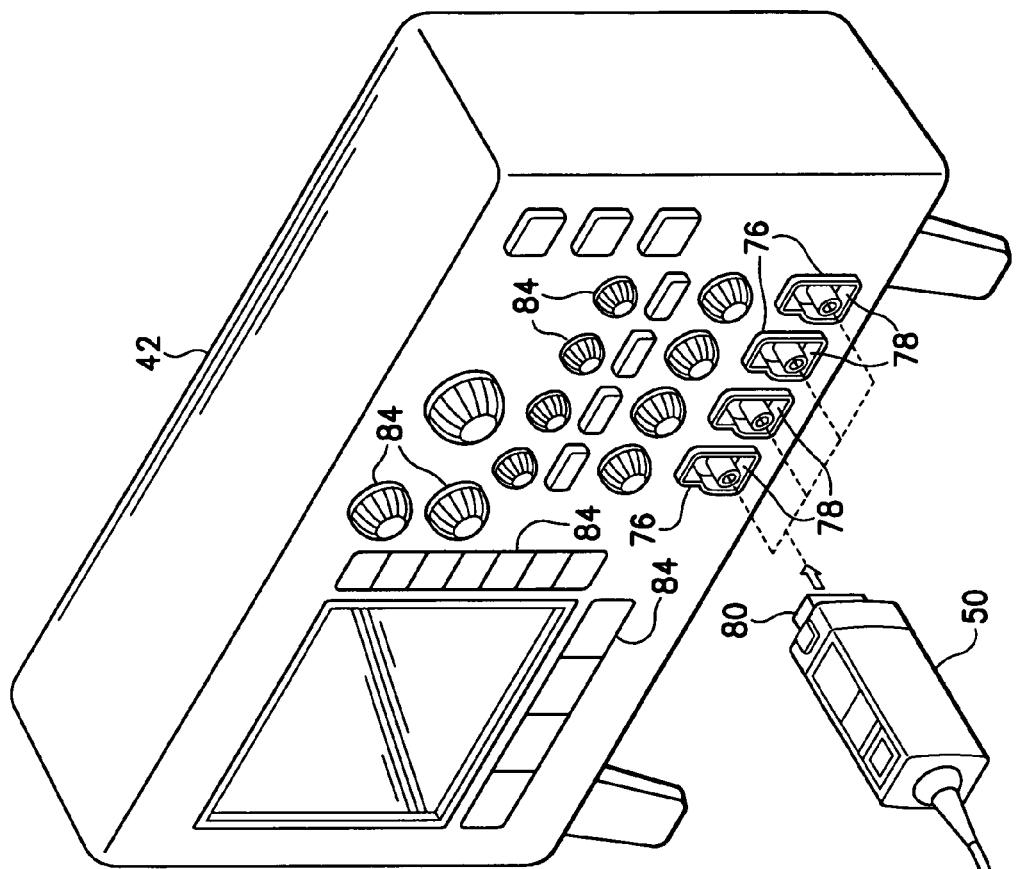
FIG. 2 is a perspective view of a current probe incorporating the input by-pass circuit according to the present invention.
Figure 2:
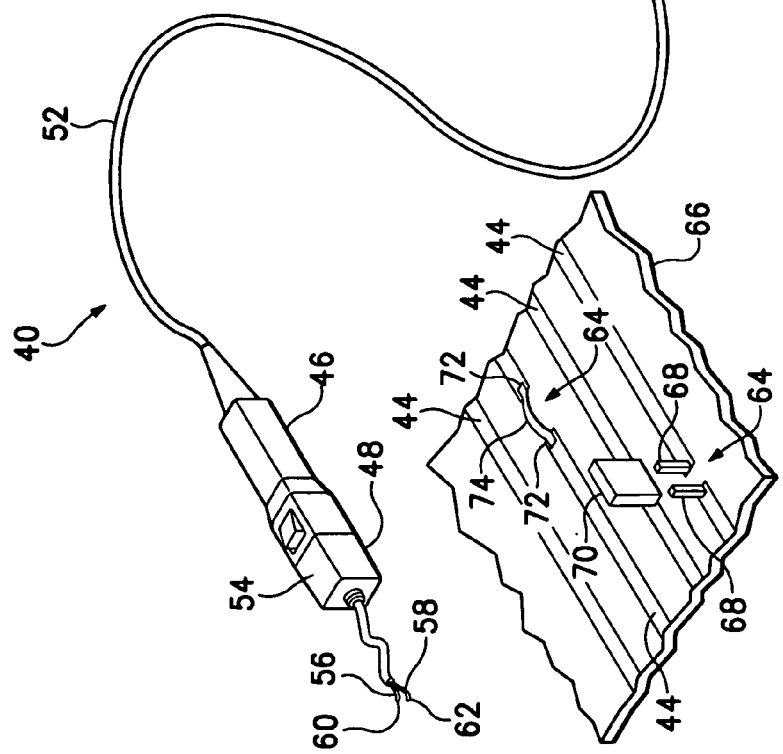

FIG. 2 is a perspective view of a current probe 40 for use with an oscilloscope 42 having an input by-pass circuit for selectively coupling a current signal from a current carrying conductor 44 to a current sensing circuit in the current probe 40. The current probe 40 has a probe body 46, an attachable adapter 48, a control box 50 and a conductive cable 52 coupling the probe body 46 to the control box 50. The adapter 48 has a housing 54 from which extends electrically conductive leads 56 and 58. Various types of electrical contacts 60, 62 are provided on the electrically conductive leads 56 and 58 of the current probe adapter 48. The electrical contacts are adapted for electrically coupling across a non-conductive gap 64 formed in the current carrying conductors 44, such as a circuit trace formed on a circuit board 66 or the like. In one instance, the electrical contacts 60, 62 are electrically conductive sockets for engaging square pins 68 that are mounted on current carrying conductor 44 on either side of the non-conductive gap 64. An electrical jumper 70 is positioned in the square pins 68 for coupling the current signal across the non-conductive gap 64 when the current probe adapter 48 is not coupled to the current carrying conductor 44. In another instance, the electrical contacts are contact pads that are electrically coupled to contacts pads 72 formed on the current carrying conductor 44 on either side of the non-conductive gap 64. A removable electrical conductive foil 74 is secured to the contact pads 72 for coupling the current signal across the non-conductive gap 64. The electrically conductive foil 72 is removed from the current carrying conductor 44 when the electrically conductive leads 56 and 58 of the adapter 48 are coupled to the current carrying conductor 44.

The conductive cable 52 has various electrical lines for coupling an output signal from a current sensing circuit disposed in the probe body 46 to the control box 50, and coupling electrical power and communications signals to current sensing circuit and the input by-pass circuit disposed in the current probe body 46. The current probe control box 50 is coupled to one of a number of input signal channels 76 of the oscilloscope 42. Each input signal channels 76 has a receptacle interface 78 with each interface having electrically conductive contacts and a coaxial signal jack. The current probe control box 50 has an plug interface 80 that mates with the receptacle interfaces 78 and has electrical contacts and a coaxial signal jack that interface with the corresponding electrical contacts and coaxial signal jack in receptacle interfaces 78. The interfaces 78 and 80 provide electrical power to the current probe 40 as well as providing communications between the current probe 40 and the oscilloscope 42. The interfaces 78 and 80 also provide a signal path between the current probe 40 and the oscilloscope 42. The oscilloscope 42 has a display device 82, such as a liquid crystal display, cathode ray tube or the like, and buttons and knobs 84 for controlling the functions of the oscilloscope 42

Figure 3:
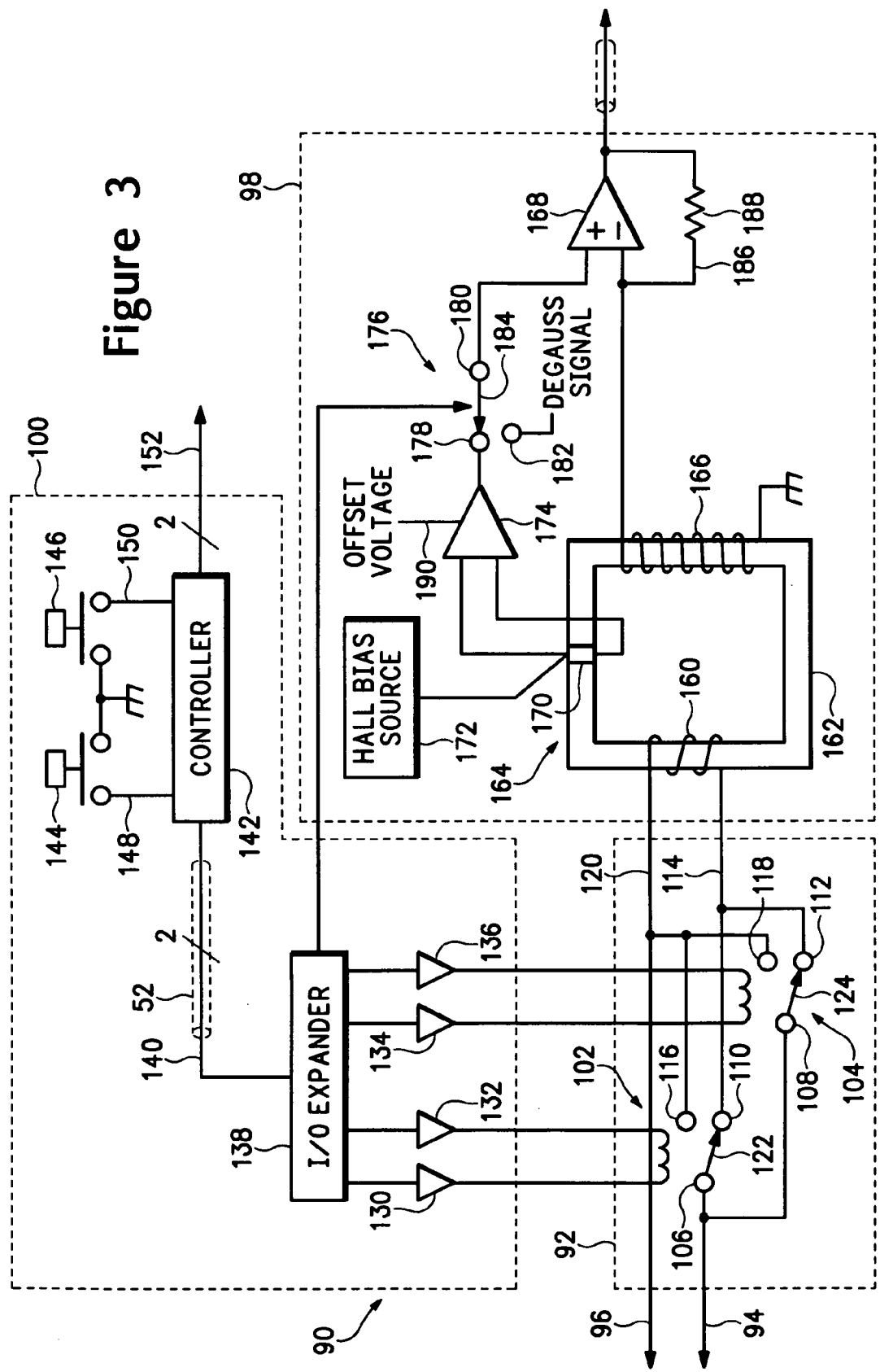
FIG. 3 is schematic representation illustrating a first embodiment of the input by-pass circuit according to the present invention.

Referring to FIG. 3, there is shown a representative schematic of the circuitry in the current probe body 46 implementing the input by-pass circuit 90. The input by-pass circuit 90 has a switching circuit 92 coupled between circuit probe inputs 94 and 96 and a current sensing circuit 98. The current probe inputs 94 and 96 are coupled to the current carrying conductor 44 via the electrically conductive leads 56 and 58 in the adapter 48. A switch control circuit 100 is coupled to the switching circuit 92 for providing switching signal for coupling and decoupling the current probe inputs 94 and 96 from the current sensing circuit 98 without disrupting the current flowing the in the current carrying conductor 44.

The switching circuit has first and second switches 102 and 104 with each switch 102 and 104 having a common terminal 106, 108 coupled to one of the current probe inputs 94, 96. Each switch 102 and 104 has a second terminal 110, 112 coupled to a first input 114 of the current sensing circuit 98. Each switch 102 and 104 has a third terminal 116, 118 coupled to the other of the current probe inputs 94, 96 and a second input 120 of the current sensing circuit 98. Each switch 102 and 104 has an armature 122, 124 that selectively couples the first switch terminal 106, 108 to one or the other of the second and third switch terminals 110, 112, 116, 118.

In the preferred embodiment, the first and second switches 102 and 104 are magnetic latch relays that receive activations signals from the switch control circuit 100. The activation signals are coupled via buffers 130, 132, 134, and 136 from a serial-to-parallel I/O expander 138. The serial-to-parallel I/O expander receives serial data and a clock signal via a serial bus 140, such as an I²C bus, SPI bus or the like disposed in the conductive cable 52. The serial data and clock are generated by a controller 142 disposed in the current probe control box 50. The control box 50 has push-button contact switches 144 and 146 mounted thereon and electrically coupled to signal lines 148 and 150 coupled to inputs on the controller 142. The controller 142 has a further serial bus 152 for communicating with the oscilloscope 42.

The inputs 114 and 120 of the current sensing circuit are coupled to opposing ends of a primary winding 160 wrapped around a magnetic core 162 of a transformer 164. The transformer 164 has a secondary winding 166 wrapped around the magnetic core 162 with one end of the secondary winding 166 coupled to electrical ground and the other end coupled to the inverting input of a transimpedance amplifier 168. The magnetic core 162 has a Hall effect device 170 disposed therein that is substantially perpendicular to the lines of flux in the magnetic core 120. The Hall effect device 170 has a first pair of terminals coupled between a bias source 172 and ground and a second pair of terminals connected to inputs of a differential amplifier 174. The single ended output of the differential amplifier 174 is coupled to the non-inverting input of the transimpedance amplifier 168 via a degaussing switch 176. The degaussing switch 176 has a first terminal 178 coupled to the output of the differential amplifier 174, a second terminal 180 coupled to the non-inverting input of the transimpedance amplifier 168, and a third terminal 182 coupled to receive a degaussing signal. An armature 184 selectively couples the output of the differential amplifier 174 or the degaussing signal to the non-inverting input of the transimpedance amplifier 168. The inverting input and output of the transimpedance amplifier 168 are coupled together via a current signal path 186 having a transimpedance resistor 188. Offset control signals may also be applied to the differential amplifier 174 via an offset voltage line 190.

The current flowing through the current carrying conductor 44 may at times exceed the current rating of the current probe 40 causing the magnetic core 162 of the transformer 164 to saturate. If a user knows when this condition may occur, the switching circuit 92 can be activated to decouple and bypass the primary winding 160 of transformer 164 from the inputs 94 and 96. One of the push-button contact switches 144 and 146 is designated for this purpose and is pressed by the user. The switches 144, 146 are coupled to electrical ground which initiates logic low signals to the controller 142. Alternately, the switches 144, 146 may be coupled to a voltage source which initiates logic high signals to the controller 142. In the current example, switch 144 is pressed which generates a logic low to the controller 142. In the preferred embodiment, the logic signal causes the controller 142 to generate serial data indicating that switch 142 has been pressed which is coupled via the serial bus 152 to the oscilloscope 12. The oscilloscope 12 generates serial data commands back to the controller 142 to activate the switching circuit 92. The oscilloscope 12 may cause an icon to be generates on the oscilloscope display 82 indicating that the input by-pass circuit 90 is activated. The controller 142 generates serial data commands that are coupled to the I/O expander 138 via the serial bus 140. The I/O expander 138 converts the serial data commands into parallel data that are applied to output pins on the I/O expander 138. The parallel data consists of high and low logic levels that cause the armatures 122 and 124 of switches 102 and 104 to change positions. In the drawing of FIG. 3, the armatures 122 and 124 are positioned to couple the current signal from the current carrying conductor 44 to the primary winding 160 of transformer 162. The controller 142 outputs a first serial data command that results in a parallel output signal from the I/O expander 138 having a logic high and logic low across one of the relays of switches 102, 104, such as switch 102. This causes the armature 122 to switch from contact 110 to contact 116 and shorts the current signal across the primary winding 160. The controller 142 outputs a second serial command that results in a parallel output signal from the I/O expander 138 having a logic high and logic low across the other switch 104. This causes the armature 124 to switch from contact 112 to contact 118 and decouple the primary winding 160 from the inputs 94 and 96. In the preferred embodiment, there is a delay between the first and second serial data commands from the controller 142 to make sure the current signal is being shorted between the inputs 94 and 96 prior to the primary winding 160 being decoupled from the inputs 94 and 96. This assures that there is no disruption of the current signal flowing in the current carrying conductor 44. Alternately, the logic low signal generated by switch 142 may be interpreted directly by the controller 142 which generates the serial data commands to the I/O expander 138. The controller 142 may also generate serial data commands to the oscilloscope 42 for generating the icon on the oscilloscope display 82 indicating that the input by-pass circuit 90 is activated.

When degaussing the current probe 40, a decreasing signal is applied to the secondary winding 166 of the transformer 164. The degaussing signal induces a current in the primary winding 160 that is coupled on the current carrying conductor 44. The signal may cause damage to circuitry coupled to the current carrying conductor 44. Additionally, an incorrect DC offset may be generated as a result of the degaussing process if the current carrying conductor 44 is coupling a current signal to the primary winding 160 of the transformer 164. For this reason, the current probe should not be electrically coupled to the current carrying conductor 44 during degaussing of the current probe 40. In prior art current probes, the current carrying conductor, which acts as the primary winding of the transformer is removed from the transformer. The presently described current probe 40 does not use the current carrying conductor 44 as the primary winding but has a separate primary winding 160 electrically coupled to the current carrying conductor 44. The switching circuit 92 allows the current probe 40 to remain coupled to the current carrying conductor 44 during the degaussing of the probe 40.

The other of the push-button contact switches 144 and 146 is designated for degaussing the probe and is pressed by the user. The switch 144, 146 initiates a logic signal to the controller 142. The logic signal is interpreted by the controller 142 as a degaussing command which generates serial data commands that are coupled to the I/O expander 138 via the serial bus 140. The I/O expander 138 converts the serial data commands into parallel data that are applied to output pins on the I/O expander 138. The parallel data consists of high and low logic levels that cause the armatures 122 and 124 of switches 102 and 104 to change positions as previously described. A further serial data command is sent that results in a logic high being generated by the I/O expander 138 that is coupled to the degaussing switch 176. The degaussing switch responds to the logic high signal by coupling the degaussing signal to the non-inverting input of the transimpedance amplifier 168. The transimpedance amplifier responds by generating a degaussing voltage signal on the output of the transimpedance amplifier 168. The voltage output causes a decreasing current signal to be generated through the current signal path 186. The decreasing current signal is coupled to the secondary winding 166 of transformer 164 to degauss the transformer 164. The controller 142 may also generate serial data commands to the oscilloscope 42 for generating an icon on the oscilloscope display 82 indicating that the current probe 40 is being degaussed. After the current probe 40 is degaussed, the controller 142 issues a further set of serial data commands that causes the switches 102, 104 and 176 to deactivate so as to re-couple the inputs 94 and 96 to the current sensing circuit 98 and coupled the output of the differential amplifier 174 to the non-inverting input of the transimpedance amplifier 168.

Figure 4:
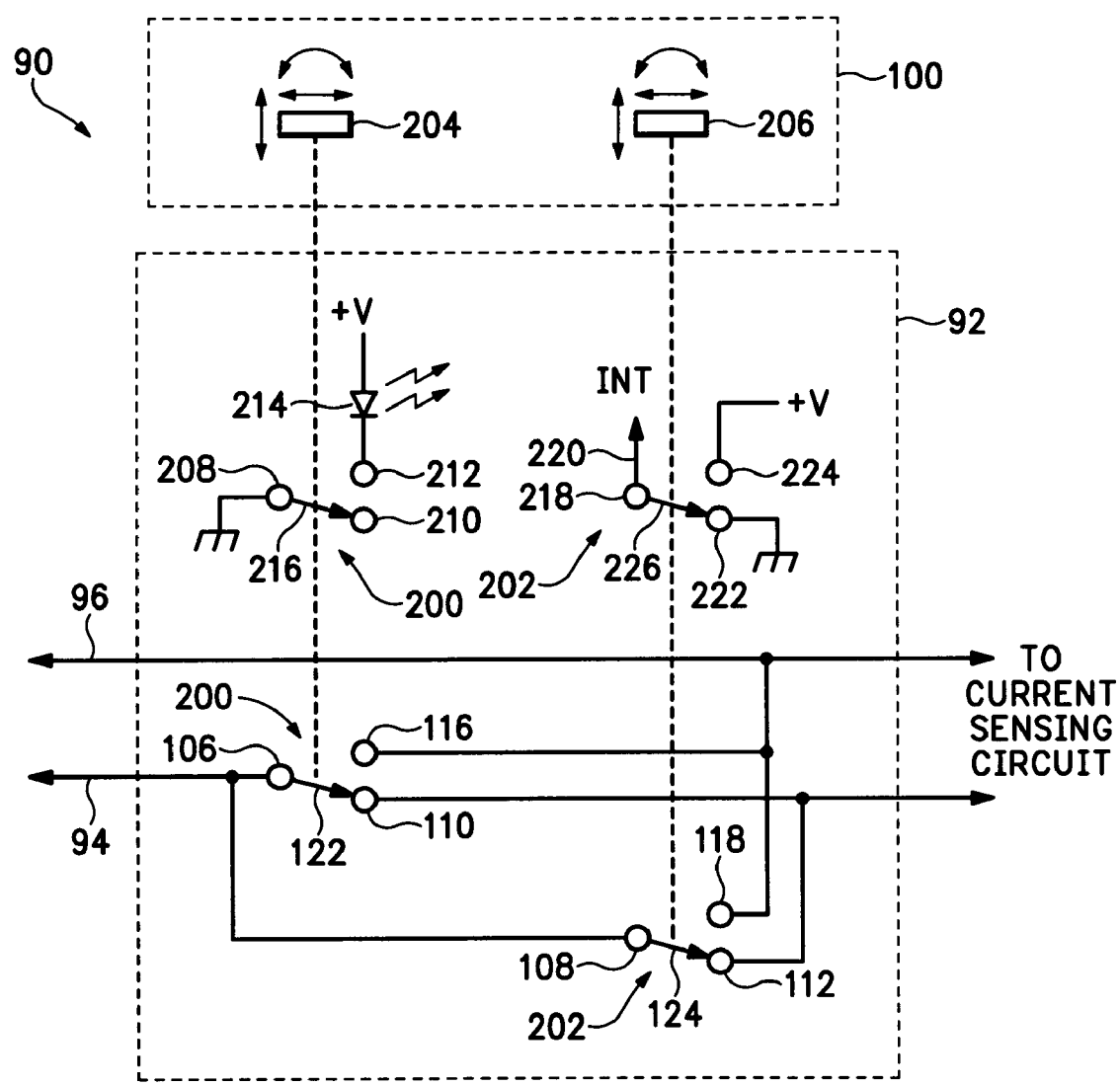
FIG. 4 is a schematic representation illustrating a further embodiment of the input by-pass circuit according to the present invention.

Referring to FIG. 4, there is shown a further embodiment of the input by-pass circuit 90. Like elements from FIG. 3 are labeled the same in FIG. 4. The magnetic latch relays used for the first and second switches 102 and 104 in the previous embodiment are replaced with mechanical switches 200 and 202. In one implementation, the mechanical switches 200 and 202 are single-pole-double-throw switches. The mechanical switches 200 and 202 have respective terminals 106, 110, 116 and 108, 112, 118 coupled in the same manner as the switches 102 and 104. The armature 122 of switch 200 is mechanically coupled to an actuator 204 extending from the probe body 46. The armature 124 of switch 202 is mechanically coupled to an actuator 206 extending on the probe body 46. The actuators 204 and 206 may be slide actuators, push-button actuators or rotatable actuators with the actuators 202 and 204 bring ganged together so that operating the actuators causes the switching of one of the armatures 122 and then the other armature 124. The actuators 204 and 206 function as the switch control 100 in the current implementation. The input by-pass circuit 90 using the mechanical switches operates in the similar manner to the input by-pass circuit 90 of FIG. 3. The armatures 122 and 124 are shown positioned to couple the current probe inputs 94 and 96 to the current sensing circuit 98. Moving the actuator 204 of switch 200 causes the armature 122 to switch from contact 110 to contact 116 and shorts current probe inputs 94 and 96 together. Moving the actuator 206 of switch 202 causes the armature 124 to switch from contact 112 to contact 118 and decouples the current sensing circuit 90 from the inputs 94 and 96. The actuators 204 and 206 are mechanically configured to provide delay between the switching of the armatures 122 and 124.

In another implementation, the mechanical switches 200 and 202 are double-pole-double-throw devices. Switch 200 has a second set of terminals 208, 210 and 212 with terminal 208 coupled to electrical ground, terminal 210 left open and terminal 212 coupled to a voltage source via a light emitting diode 214 mounted to the probe body 46. An armature 216 selectively couples terminal 208 to terminals 210 and 212 and is activated by the actuator 204. Switch 202 has a second set of terminals 218, 222 and 224 with terminal 218 coupled to a signal line 220, terminal 222 coupled to ground and terminals 224 coupled to a voltage source. An armature 226 selectively couples the terminal 218 to terminals 222 and 224 and is activated by actuator 206.

The use of the double-pole-double-throw mechanical switches 200 and 202 allows the use of circuitry for indicating when the input by-pass circuit 90 is active. In one instance, the actuator 216 completes a circuit activating the light emitting diode to give an indication that the input by-pass circuit 90 is active. In the other instance, the actuator 226 couples an active high logic level to the signal line 220 which is coupled to the controller 142. The controller 142 initiates a serial data command signal to the oscilloscope 42 via the serial bus 152 which causes the oscilloscope to generate an indication on the display device 82 that the input by-pass circuit is active. Generally, one or the other of the indicating configurations is used with implementation.

It will be obvious to those having skill in the art that many changes may be made to the details of the above-described embodiments of this invention without departing from the underlying principles thereof. The scope of the present invention should, therefore, be determined only by the following claims.

What is claimed is:

1. In a current probe having inputs coupled in series across a non-conductive gap in a device under test with the current probe inputs coupled to a current sensing circuit for receiving a current signal from the device under test, an input by-pass circuit comprising:

a switching circuit coupled between the current probe inputs and the current sensing circuit having first and second switches with each of the first and second switches having a common terminal coupled to the one of the current probe inputs, a first terminal coupled to the current sensing circuit and a second terminal coupled to the other of the current probe inputs with the other of the current probe inputs coupled to the sensing circuit such that the first and second switches couple the current signal to the current sensing circuit when the common switch terminals of the first and second switches are coupled to the first terminals of the first and second switches, and the first and second switches couple the current signal between the current probe inputs when the common switch terminals of the first and second switches are coupled to the second terminals of the first and second switches; and a switch control coupled to the switching circuit for selectively coupling and decoupling the current probe inputs to the current sensing circuit such that the current signal continuously flows in the device under test.

2. The input by-pass circuit as recited in claim 1 wherein the first and second switches are relays.

3. The input by-pass circuit as recited in claim 2 wherein the switch control comprises at least a first activation switch for initiating a signal to cause the first and second switches to selectively couple and decouple the current probe inputs from the current sensing circuit with the switching of one of the first and second switches being delayed with respect to the other.

4. The input by-pass circuit as recited in claim 3 wherein the switch control comprises at least a first activation switch generating a signal to a controller for initiating the generation of command signals coupled to a serial-to-parallel I/O expander that generates parallel output data for selectively coupling and decoupling the current probe inputs from the current sensing circuit with one of the command signals delaying one of the first and second switches with respect to the other.

5. The input by-pass circuit as recited in claim 3 wherein the wherein the switch control comprises a second activation switch generating a signal to a controller for initiating the generation of command signals coupled to a serial-to-parallel I/O expander that generates parallel output data for selectively decoupling the current probe inputs from the current sensing circuit with one of the command signals delaying one of the first and second switches with respect to the other and another command signal coupling a degaussing signal to the current sensing circuit.

6. The input by-pass circuit as recited in claim 1 wherein the first and second switches are mechanical switches and the switch control is a first actuator mechanically coupled to the first mechanical switch and a second actuator coupled to the second mechanical switch.

* * * * *